United States Patent [19]
Abe

[11] Patent Number: 5,926,424
[45] Date of Patent: Jul. 20, 1999

[54] SEMICONDUCTOR MEMORY DEVICE CAPABLE OF PERFORMING INTERNAL TEST AT HIGH SPEED

[76] Inventor: Hideaki Abe, c/o Mitsubishi Denki Kabushiki Kaisha 2-3, Marunouchi 2-chome, Chiyoda-ku, Tokyo 100-8310, Japan

[21] Appl. No.: 09/225,451

[22] Filed: Jan. 6, 1999

[30] Foreign Application Priority Data

Jul. 6, 1998 [JP] Japan .................................. 10-190539

[51] Int. Cl.$^6$ .................................................. G11C 29/00
[52] U.S. Cl. ................ 365/201; 365/189.05; 365/189.07
[58] Field of Search ................ 365/201, 189.0, 365/189.07

[56] References Cited

U.S. PATENT DOCUMENTS

| 5,535,171 | 7/1996 | Kim et al. | 365/233 |
| 5,661,729 | 8/1997 | Miyazaki et al. | 365/201 |

*Primary Examiner*—Andrew Q. Tran

[57] ABSTRACT

The semiconductor memory device includes a data generation circuit and a tristate buffer portion. The data generation circuit generates test data in block units in accordance with a combination of signals received from an external pin. The tristate buffer portion directly writes the test data to an SRAM bit line. After the test data is written to a DRAM array, data corresponding to the test data is read. In a data comparison and determination circuit included in a data transfer buffer read data in block units is compared and determined. The determination results are collectively output to a signal line.

19 Claims, 10 Drawing Sheets

SEMICONDUCTOR MEMORY DEVICE CAPABLE OF PERFORMING INTERNAL TEST AT HIGH SPEED

BACKGROUND OF THE INVENTION

1. Field of the Invention

The present invention relates to a semiconductor memory device and most specifically to a semiconductor memory device having the configuration of a cache DRAM.

2. Description of the Background Art

Since the performance such as operation speed of computer systems has recently considerably improved especially in CPUs, a larger band width is in great demand for DRAMs (dynamic RAMs) as well.

As one solution to this problem, "cache DRAMs" have been proposed. In the cache DRAM, a DRAM and an SRAM (static RAM) are formed on one chip to embody, on the one chip, the concept of the cache system.

The cache DRAM is intended to eliminate a speed gap between a CPU and a DRAM by inserting an SRAM and to satisfy the requirements of a high band width in the system by connecting the SRAM and the DRAM with a high band width internal bus.

A conventional semiconductor memory device will be described in the following with reference to FIG. 10. The conventional semiconductor memory device 9000 shown in FIG. 10 has the configuration of a cache DRAM.

The DRAM portion of semiconductor memory device 9000 includes a row selection decoder 105, a column selection decoder 106 and a DRAM array 100. DRAM array 100 includes a plurality of memory cells arranged in rows and columns.

The SRAM portion of semiconductor memory device 9000 includes a row selection decoder 107, a column selection decoder 108 and an SRAM array 102. SRAM array 102 includes a plurality of memory cells arranged in rows and columns.

Conventional semiconductor memory device 9000 further includes a data transfer buffer 901. Data transfer buffer 901 transmits and receives data to and from SRAM array 102 through an SRAM bit line 103. Data transfer buffer 901 also transmits and receives data to and from DRAM array 100 through an internal transfer bus 104.

When such a DRAM portion is to be tested, the following operation is required in conventional semiconductor memory device 9000.

First, data is written to SRAM array 102 (step 1). Then, the data written to SRAM array 102 is transferred to DRAM array 100 (step 2). Then, the data written to DRAM array 100 is transferred to SRAM array 102 (step 3). Thereafter, the data is read from SRAM array 102 (step 4).

However, the number of pins for performing the write/read operations of SRAM array 102 is not so large because of the problems of a system limit and a bus interconnection in the system. Compared with the number of inputs and outputs for the SRAM portion, however, the number of internal transfer buses connecting the SRAM portion and the DRAM portion tends to increase to satisfy the requirements of a high band width.

Accordingly, the process of steps 1 and 4 described above has to be performed a quite larger number of times than the process of steps 2 and 3.

It is assumed as an example that DRAM array 100 has 2 rows and 64 columns with one column consisting of 256 bits, data transfer buffer 901 includes a plurality of buffers which correspond to the bits forming one column, SRAM array 102 has 1 row and 8 columns, with the bit size per column is 256 bits, and there are 32-bit (not shown) inputs/outputs between SRAM array 102 and the outside.

In this case, the following operation is required to write data to the entire row of DRAM array 100. First, the write operation is performed 8 times (32 bits×8=256 bits) for SRAM array 102. Then, 256-bit data is transferred from SRAM array 102 to DRAM array 100. This operation is performed 64 times to transfer data of the entire row from the SRAM portion to the DRAM portion.

Further, the following operation is required to read data of the entire row of DRAM array 100. First, 256-bit data is transferred from DRAM array 100 to SRAM array 102. Then, the read operation is performed 8 times for SRAM array 102. This operation is performed 64 times to read all data.

In a series of the write/read operations described above, the DRAM portion is accessed 128 times and the SRAM portion is accessed more than 1024 times.

Thus, in the conventional cache DRAM including an SRAM, access to the SRAM portion is indispensable to test the DRAM portion. Since the SRAM portion is accessed more frequently than the DRAM portion, there is a tendency to increase the test time of the internal operation and complicate the test program. Since the internal buses are increasing to improve the band width, the tendency becomes conspicuous.

Since a large number of pins are required to control the DRAM portion and the SRAM portion in the conventional configuration, an expensive tester has to be used.

SUMMARY OF THE INVENTION

Accordingly, an object of the present invention is to provide a semiconductor memory device allowing easy testing of a DRAM portion in a cache DRAM.

A semiconductor memory device according to the present invention includes a dynamic memory cell array having a plurality of memory cells, a static memory cell array, a transfer buffer for transmitting and receiving data between the dynamic memory cell array and the static memory cell array, a bus for transmitting and receiving data between the static memory cell array and the transfer buffer, a test data generation circuit for generating test data in block units corresponding to a prescribed number of memory cells in accordance with an external signal in a test mode to directly write the data to the bus, and a writing circuit for writing the data in block units received by the transfer buffer from the bus to the dynamic memory cell array.

Accordingly, a major advantage of the present invention is that test data in block units can be written to the DRAM array without being passed through the SRAM portion by externally directly controlling the bus connecting the SRAM array and the data transfer buffer, according to the semiconductor memory device. As a result, the test can be performed easily. Further, the number of pins used can be reduced and an inexpensive tester can be used for the test by reducing access to the SRAM portion.

Specifically, whether the DRAM data is correct or not is collectively determined by using the data in block units (corresponding to test data) read from the DRAM array. Thus, the determination results can be compressed and taken out as one signal. The determination results can be observed from one external output pin, for example.

Specifically, when a register for storing the generated test data is provided, whether the DRAM data is correct or not is collectively determined by comparing the data in block units (corresponding to the test data) read from the DRAM portion and the register contents. Thus, a test for a random data pattern can be performed.

Specifically, for the data in block units read from the DRAM array, comparison is performed between data read from memory cells to which the same test data is written. According to the comparison results, whether the DRAM data is correct or not can be determined collectively. Thus, the determination results can be compressed and taken out as one signal. The determination results can be observed from one external output pin, for example.

Specifically, the data in block units (corresponding to the test data) read from the DRAM array is compared with expected value data in block units generated in the same test data generation circuit. Thus, a test for a random data pattern can be performed. A silicon penalty is also reduced.

According to the comparison results, whether the DRAM data is correct or not is determined collectively. Thus, the determination results can be compressed and taken out as one signal. The determination results can be observed from one external output pin, for example.

Specifically, various test data can be generated according to a combination of signals received from an external pin. Further, the test data can be directly written to the bus. As a result, the test can be performed by using the various test data.

Specifically, various test data and various expected value data can be generated according to a combination of signals received from an external pin. Further, the test data and the expected value data can be directly written to the bus. As a result, various tests can be performed.

Specifically, the determination results as a compressed signal are written to the SRAM array. Thus, the determination results in block units can be read easily by a normal operation.

Further, a semiconductor memory device according to the present invention includes a dynamic memory cell array including a plurality of memory cells, a static memory cell array, a transfer buffer for transmitting and receiving data between the dynamic memory cell array and the static memory cell array, a read bus for transmitting data from the static memory cell array to the transfer buffer, a write bus for transmitting data from the transfer buffer to the static memory cell array, a test data generation circuit for generating test data in block units corresponding to a prescribed number of memory cells in accordance with an external signal in a test mode to directly write the data to the read bus and the write bus, a first write circuit for writing the data in block units received by the transfer buffer through the read bus to the dynamic memory cell array, and a second write circuit for writing the data in block units received from the write bus to the static memory cell array.

Accordingly, another advantage of the present invention is that the test data can be written easily to the DRAM array and the SRAM array by providing a read only bus and a write only bus connecting the SRAM array and the transfer buffer and externally directly controlling them.

Specifically, whether the DRAM data is correct or not can be determined collectively by simultaneously reading the data in block units (corresponding to the test data) read from DRAM portion and the test data in block units written to the SRAM portion and using the read data. Thus, the determination results can be compressed and taken out as one signal.

The determination results can be observed from one external output pin, for example.

Specifically, various test data can be generated according to a combination of signals received from an external pin. Further, the test data can be directly written to the read only bus and the write only bus. As a result, the test can be performed by using the various test data.

Specifically, the determination results as a compressed signal are written to the SRAM array. Thus, the determination results in block units can be read easily by a normal operation.

A semiconductor memory device according to the present invention includes a dynamic memory cell array including a plurality of memory cells, a static memory cell array, a transfer buffer for transmitting and receiving data between the dynamic memory cell array and the static memory cell array, a bus for transmitting and receiving data between the static memory cell array and the transfer buffer, a test data generation circuit for generating test data in block units corresponding to a prescribed number of memory cells in accordance with an external signal in a test mode to directly write the data to the transfer buffer, and a writing circuit for writing the data in block units received by transfer buffer to the dynamic memory cell array, the transfer buffer transferring the test data in block units to the dynamic memory cell array in the test mode and transferring data received from the bus to the dynamic memory cell array in a mode other than the test mode.

Accordingly, a further advantage of the present invention is that the test data in block units can be written to the DRAM array without being passed through the SRAM portion by externally directly controlling the data transfer buffer. As a result, the test can be performed easily. Further, the number of pins used can be reduced and an inexpensive tester can be used for the test by reducing access to the SRAM portion.

Specifically, whether the DRAM data is correct or not can be determined collectively by using the data in block units (corresponding to the test data) received from the DRAM array. The determination results can be compressed and taken out as one signal. The determination results can be observed by one external output pin, for example.

Specifically, various test data can be generated according to a combination of signals received from an external pin. Further, the test data can be directly written to the data transfer buffer. As a result, the test can be performed by using the various test data.

Specifically, the determination results as a compressed signal are written to the SRAM array. Thus, the determination results in block units can be read easily by a normal operation.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 10:
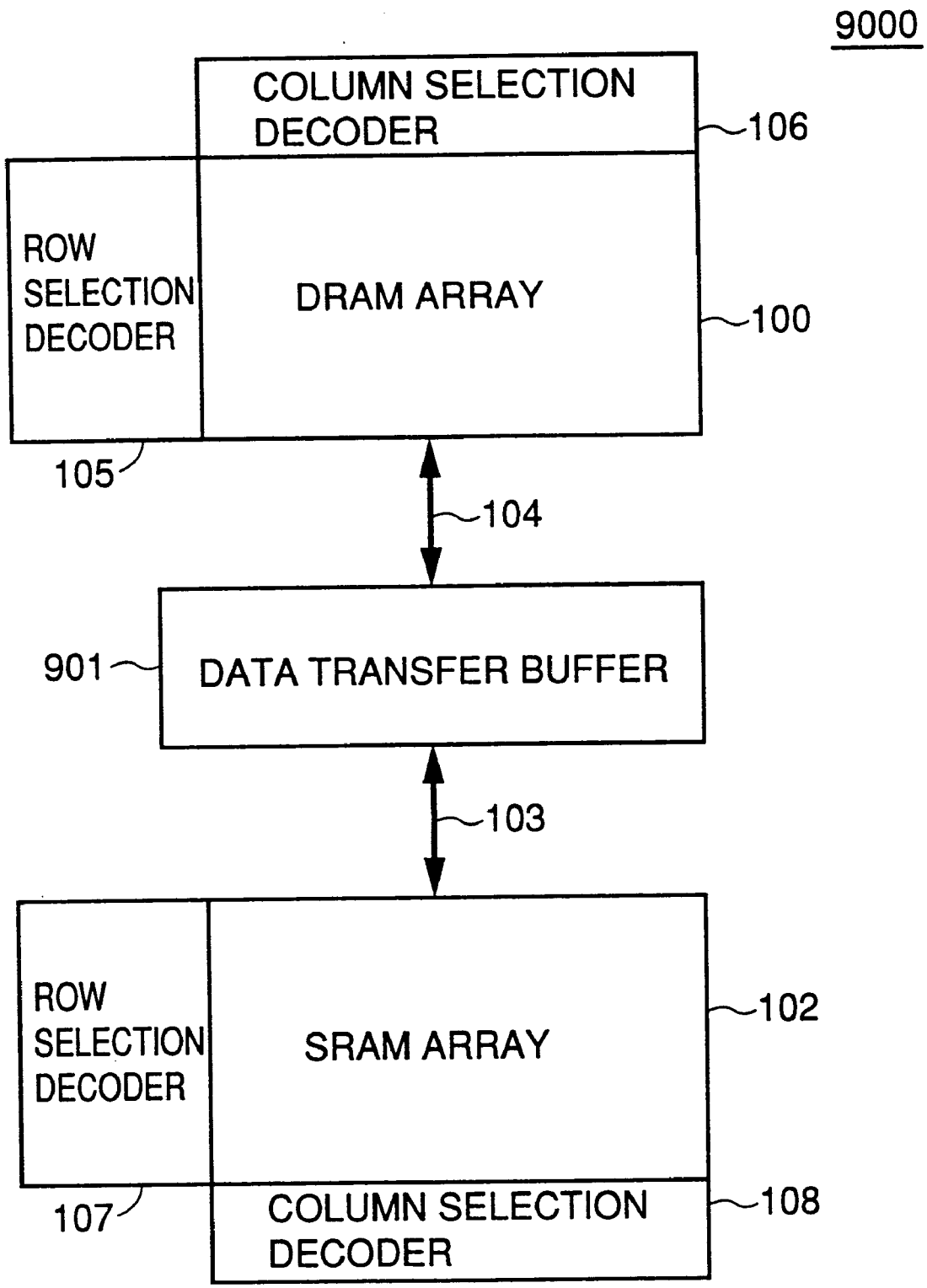
FIG. 10 shows an overall configuration of a conventional semiconductor memory device 9000.

An overall configuration of a semiconductor memory device 1000 in a first embodiment of the present invention will be described with reference to FIG. 1. The same elements as conventional semiconductor memory device 9000 shown in FIG. 10 are denoted by the same reference characters and their description will not be repeated.

Figure 1:
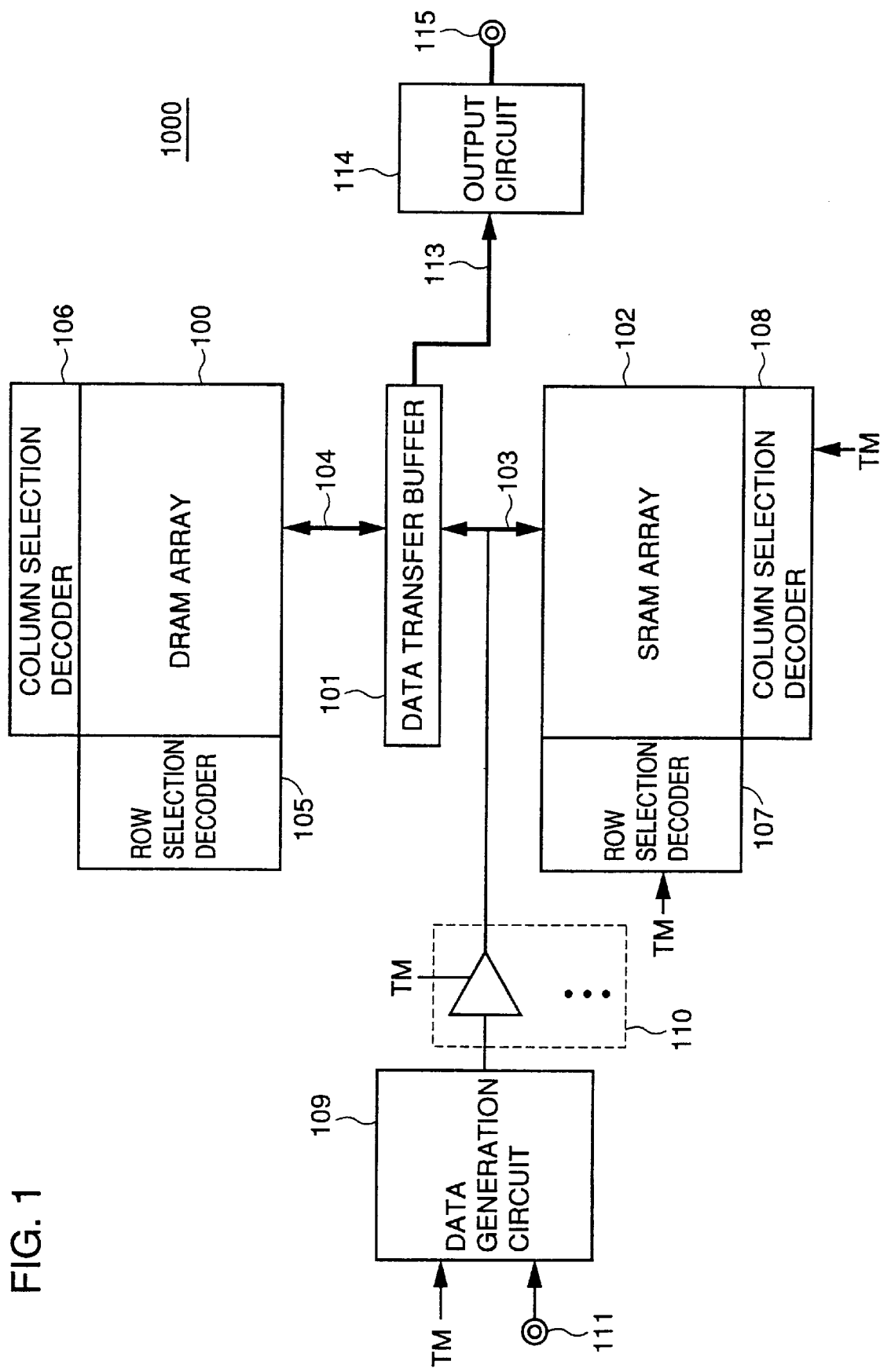
FIG. 1 is a schematic block diagram showing an overall configuration of a semiconductor memory device 1000 in a first embodiment of the present invention.

Semiconductor memory device 1000 shown in FIG. 1 is different from conventional semiconductor memory device 9000 in that semiconductor memory device 1000 includes a data transfer buffer 101 instead of data transfer buffer 901 and also includes a data generation circuit 109, a tristate buffer portion 110 and an output circuit 114.

Data generation circuit 109 generates test data to be written to a prescribed number of memory cells (hereinafter, referred to as a block unit) in a DRAM array 100 in response to a test mode signal TM designating a test mode and in accordance with a signal received from an external pin 111. For example, data generation circuit 109 generates such number of test data that corresponds to the bit size.

It is noted that data generation circuit 109 may be formed to generate the test data by using a signal received from an external address pin, or a data input/output pin which is not used in the test mode instead of external pin 111.

Test mode signal TM is activated in the test mode. The test mode is entered by various methods, for example, of causing a particular signal input from an external command pin or a voltage input higher than a conventional voltage from the address pin to function as a trigger.

Tristate buffer portion 110 includes a plurality of tristate buffers. FIG. 1 shows one tristate buffer. Each tristate buffer is arranged corresponding to an SRAM bit line.

Each tristate buffer transfers the output of data generation circuit 109 to a corresponding SRAM bit line 103 in response to test mode signal TM. Each tristate buffer independently drives a corresponding SRAM bit line.

Data transfer buffer 101 is arranged between an internal transfer bus 104 and SRAM bit line 103. Data transfer buffer 101 includes a data comparison and determination circuit for determining whether DRAM array 100 is correct or not in accordance with data in block units read from DRAM array 100.

The determination result of the data comparison and determination circuit is transferred to output circuit 114 through a signal line 113. Output circuit 114 outputs the determination result to an external output pin 115 in response to a signal on signal line 113.

A write operation of the DRAM portion in FIG. 1 semiconductor memory device 1000 in the first embodiment of the present invention will be described.

In a normal operation mode, test mode signal TM is inactive, and data generation circuit 109 and tristate buffer portion 110 are inactive. A row selection decoder 107 in the SRAM portion writes/reads desired data in response to an external address signal. Data transfer buffer 101 is in a state it can transfer data to the DRAM portion.

In a test mode, test mode signal TM is activated. In response to active test mode signal TM, row selection decoder 107 and column selection decoder 108 in the SRAM portion are inactivated. In response to active test mode signal TM, however, data generation circuit 109 and tristate buffer portion 110 are made operable.

When data transfer in block units from the SRAM portion to the DRAM portion is designated by an external command in the test mode, circuits other than row selection decoder 107 and column selection decoder 108 in the SRAM portion operate in a normal manner.

In a conventional semiconductor memory device, SRAM bit line 103 is driven by data on SRAM array 102 at this time. In the case of the first embodiment of the present invention, however, SRAM bit line 103 is driven by data generation circuit 109 and tristate buffer portion 110. As a result, generated test data in block units can be directly written to DRAM array 100 (collective writing of the data in block units).

Figure 2:
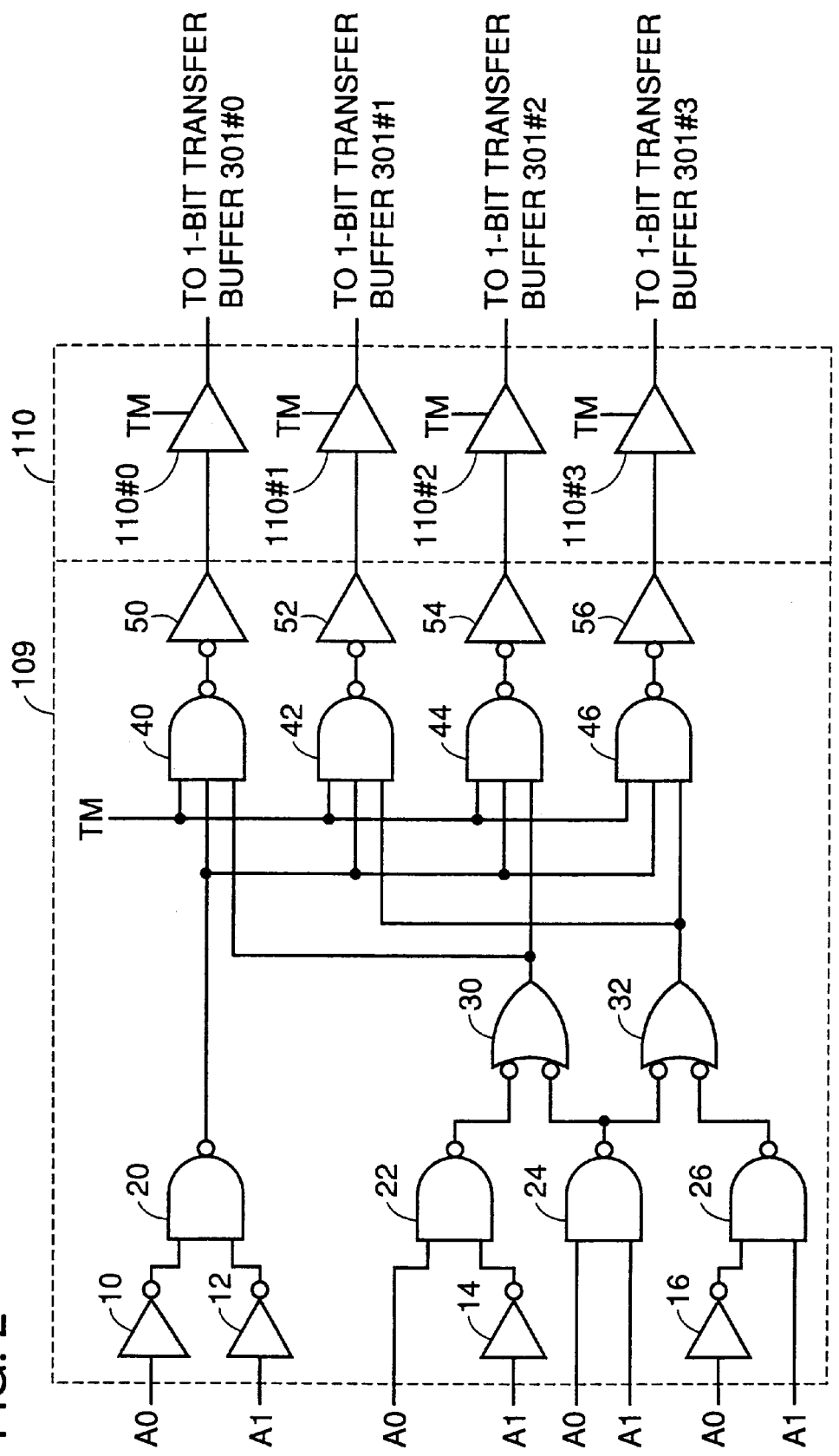
FIG. 2 is a circuit diagram showing one example of a specific configuration of data generation circuit 109 in the first embodiment of the present invention.

A specific configuration of data generation circuit 109 in the first embodiment of the present invention will be described with reference to FIG. 2. FIG. 2 shows the configuration for generating 4-bit test data by using 2-bit external address signals A0 and A1.

FIG. 2 also shows four tristate buffers 110#0 to 110#3 constituting tristate buffer portion 110.

Data outputs from tristate buffer 110#0 to 110#3 are transmitted to 1-bit transfer buffers 301#0 to 301#3 (included in data transfer buffer 101 shown in FIG. 1) described below through corresponding SRAM bit lines.

Data generation circuit 109 shown in FIG. 2 includes inverters 10, 12, 14, 16, 50, 52, 54, 56, NAND circuits 20, 22, 24, 26, 40, 42, 44, 46, and negative logic NAND circuits 30, 32.

Inverters 10 and 16 invert external address signal A0. Inverters 12 and 14 invert external address signal A1. NAND circuit 20 receives the output signals of inverters 10 and 12. NAND circuit 22 receives external address signal A0 and the output of inverter 14. NAND circuit 24 receives external address signals A0 and A1. NAND circuit 26 receives the output of inverter 16 and external address signal A1.

Negative logic NAND circuit 30 receives the output signals of NAND circuits 22 and 24. Negative logic NAND circuit 32 receives the output signals of NAND circuits 24 and 26.

NAND circuit 40, 42, 44 and 46 have their first input nodes receiving test mode signal TM. NAND circuit 40 receives the output signal of NAND circuit 20 and the output signal of negative logic NAND circuit 30. NAND circuit 42 receives the output signal of NAND circuit 20 and the output signal of negative logic NAND circuit 32. NAND circuit 44 receives the output signal of NAND circuit 20 and the output signal of negative logic NAND circuit 30. NAND circuit 46 receives the output signal of NAND circuit 20 and the output signal of negative logic NAND circuit 32.

Inverters 50, 52, 54 and 56 are arranged corresponding to NAND circuits 40, 42, 44 and 46. Inverters 50, 52, 54 and 56 invert the output signals of corresponding NAND circuits 40, 42, 44 and 46.

Tristate buffer 110#0 outputs the output signal of inverter 50 to 1-bit transfer buffer 301#0 in response to test mode signal TM. Tristate buffer 110#1 outputs the output signal of inverter 52 to 1-bit transfer buffer 301#1 in response to test mode signal TM. Tristate buffer 110#2 outputs the output signal of inverter 54 to 1-bit transfer buffer 301#2 in response to test mode signal TM. Tristate buffer 110#3 outputs the output signal of inverter 56 to 1-bit transfer buffer 301#3 in response to test mode signal TM.

By such a configuration, four kinds of test data "0000", "0101", "1010" and "1111" can be generated in accordance with the 2-bit external address signals. The generated test data is written to the DRAM portion.

Although the circuit configuration for generating four kinds of test data is illustrated in the first embodiment of the present invention, a combination of various data can be possible according to the method of using the external pins, and random patterns can be written collectively according to the number of available pins.

Data reading from DRAM array 100 will be described in the following. After the test mode is entered, a transfer command from the DRAM portion to the SRAM portion used in the normal operation mode is input.

Data in block units read from DRAM portion is transferred via data transfer buffer 101 to the SRAM portion (collective reading of the data in block units). At this time, the data is compared and determined in block units (collective determination of the data in block units) in a data comparison and determination circuit included in data transfer buffer 101.

The configuration of data transfer buffer 101 and the data comparison and determination circuit included in data transfer buffer 101 in the first embodiment of the present invention will be described in the following with reference to FIG. 3.

Figure 3:
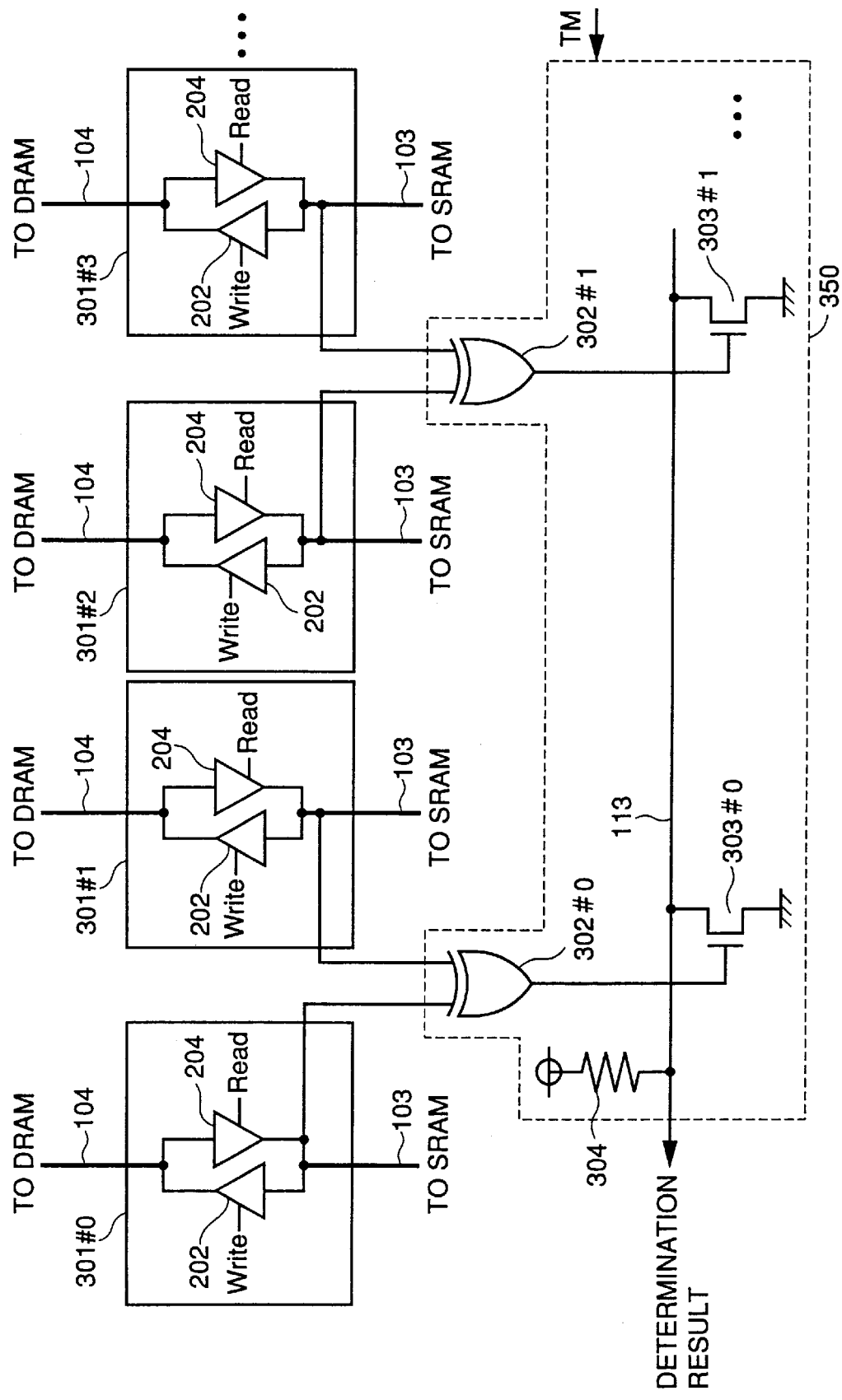
FIG. 3 shows a circuit configuration of data transfer buffer 101 in the first embodiment of the present invention.

Data transfer buffer 101 shown in FIG. 3 includes a plurality of 1-bit transfer buffers 301#0, 301#1, 301#2, 301#3, . . . . 1-bit transfer buffers 301#0, . . . are arranged between corresponding SRAM bit lines and corresponding internal transfer buses 104.

1-bit transfer buffers 301#0, . . . each include a tristate buffer 202 operating in response to a write signal Write and a tristate buffer 204 operating in response to a read signal Read.

Tristate buffer 202 outputs data on corresponding SRAM bit line 103 to corresponding internal transfer bus 104 in response to signal Write. Tristate buffer 204 outputs data on corresponding internal transfer bus 104 to corresponding SRAM bit line 103 in response to signal Read.

Data transfer buffer 101 shown in FIG. 3 also includes a data comparison and determination circuit 350. Data comparison and determination circuit 350 includes EXOR circuits 302#0, 302#1, . . . , a resistor 304, and NMOS transistors 303#0, 303#1, . . . .

Data comparison and determination circuit 350 compares, by the EXOR circuit, pieces of data transferred from the 1-bit transfer buffer to the SRAM portion. The voltage level of signal line 113 is changed in response to the comparison result. The determination result is transferred to output circuit 114 shown in FIG. 1 through signal line 113.

The EXOR circuits each receive signals from two 1-bit transfer buffers that read the same data. In the configuration of FIG. 3, EXOR circuit 302#0 receives the transfer signals of corresponding 1-bit transfer buffers 301#0 and 301#1. EXOR circuit 302#1 receives the transfer signals of corresponding 1-bit transfer buffers 301#2 and 301#3.

NMOS transistors 303#0, 303#1, . . . constitute a wired OR logic circuit. A resistor 304 corresponds to a pull-up resistor for the wired OR logic circuit. NMOS transistors 303#0, 303#1, . . . are connected between signal lines 113 and a ground potential. NMOS transistors 303#0, 303#1, . . . are arranged corresponding to EXOR circuits 302#0, 302#1, The gate electrode of NMOS transistor 303#0 receives the output signal of corresponding EXOR circuit 302#0. The gate electrode of NMOS transistor 303#1 receives the output signal of corresponding EXOR circuit 302#1.

The operation of data comparison and determination circuit 350 shown in FIG. 3 will be described. The outputs of two 1-bit transfer buffers as one set receiving the same read data in DRAM array 100 are compared in the EXOR circuit to see whether actually read data matches each other. In FIG. 3, the outputs of 1-bit transfer buffers 301#0 and 301#1 are compared, and the outputs of 1-bit transfer buffers 301#2 and 301#3 are compared.

The comparison results are output as wired OR through NMOS transistors 303#0, 303#1. When all the bits are passed (the outputs in each set are matched), the potential of signal line 113 as the determination results stays at the H-level. When any bit is failed, the potential of signal line 113 attains to the L level. The results are observed from external output pin 115 through output circuit 114 shown in FIG. 1.

The configuration of the data transfer buffer in the first embodiment of the present invention is not limited to the one shown in FIG. 3. Another example of the configuration of the data transfer buffer in the first embodiment of the present invention will be described with reference to FIG. 4.

Figure 4:
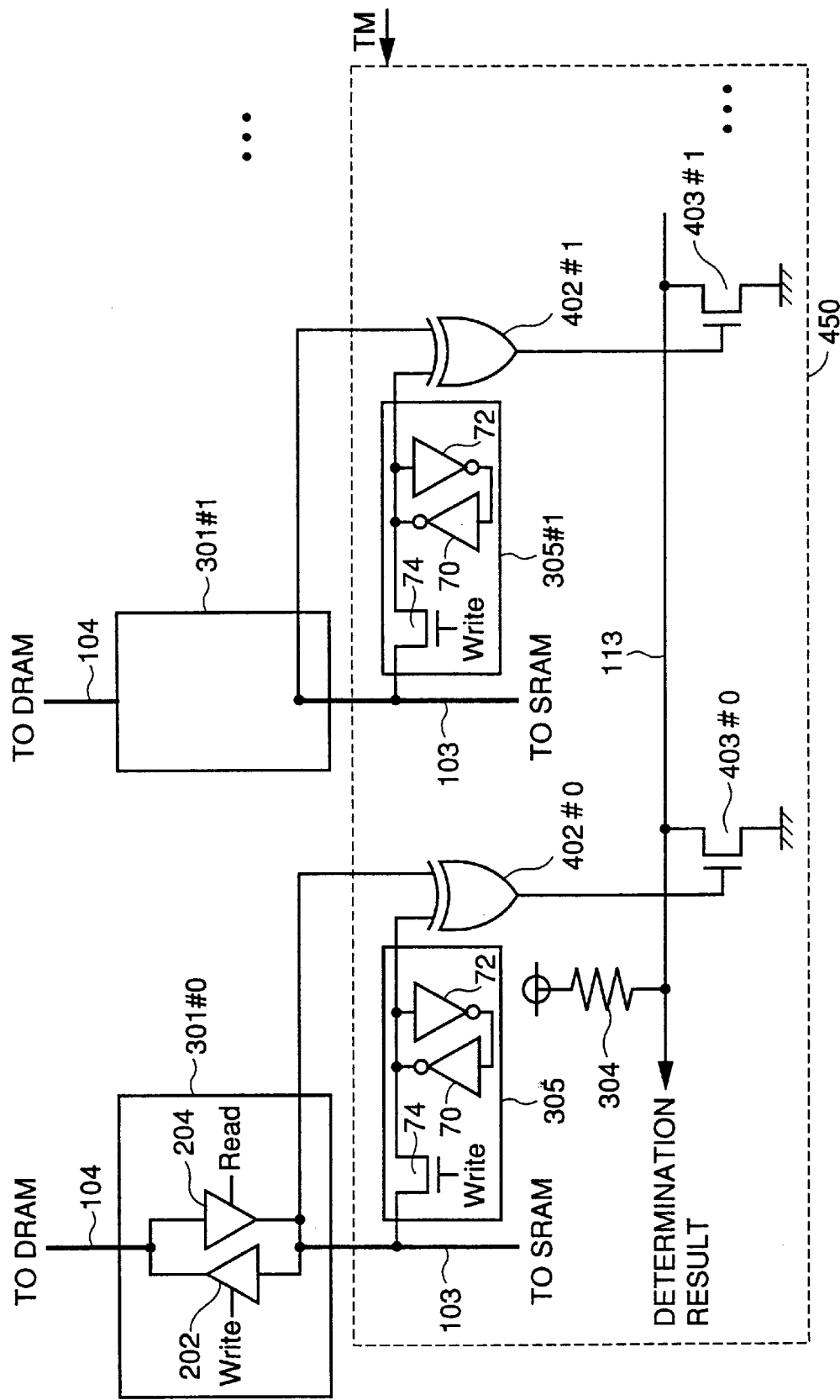
FIGS. 4 and 5 show other examples of the configuration of data transfer buffer in the first embodiment of the present invention.

A data transfer buffer shown in FIG. 4 is different from the data transfer buffer shown in FIG. 3 in that the buffer in FIG. 4 includes a data comparison and determination circuit 450 instead of data comparison and determination circuit 350.

Although data comparison and determination circuit 350 can be added to a 1-bit transfer buffer comparatively easily (that is, the number of gates is small), it is limited in that the outputs of the 1-bit transfer buffers reading the same data should be compared. Therefore, the data comparison and determination circuit can not attain sufficient functions as the comparison circuit of random data patterns.

However, data comparison and determination circuit 450 shown in FIG. 4 handles random data patterns. Data comparison and determination circuit 450 shown in FIG. 4 includes registers 305#0, 305#1, . . . , EXOR circuits 402#0, 402#1, . . . , NMOS transistors 403#0, 403#1, . . . , and a pull-up resistor 304.

Registers 305#0, 305#1, . . . are arranged corresponding to 1-bit transfer buffers 301#0, 301#1, Registers 305#0, 305#1, . . . are used to store write data when collective writing from the SRAM portion to the DRAM portion in the test mode is performed.

Register 305#0, 305#1, . . . each include inverters 70, 72 and an NMOS transistor 74. NMOS transistor 74 is arranged between a corresponding SRAM bit line and a pair of the output of inverter 70 and the input of inverter 72. Inverters 70 and 72 constitute a latch circuit. The gate electrode of NMOS transistor 74 receives signal Write.

EXOR circuits 402#0, . . . for data comparison are arranged corresponding to the 1-bit transfer buffers. EXOR circuit 402#0, . . . each compare stored data in a corresponding register and corresponding read data read from the DRAM portion. According to the comparison result, the wired OR (NMOS transistors 403#0, . . . , and pull-up resistor 304) changes the potential of signal line 113.

By thus comparing read data read from the DRAM portion and write data using the register storing write data for the DRAM portion, random data patterns can also be compared and determined.

Another example of the configuration of the data transfer buffer in the first embodiment of the present invention will be described with reference to FIG. 5.

Figure 5:
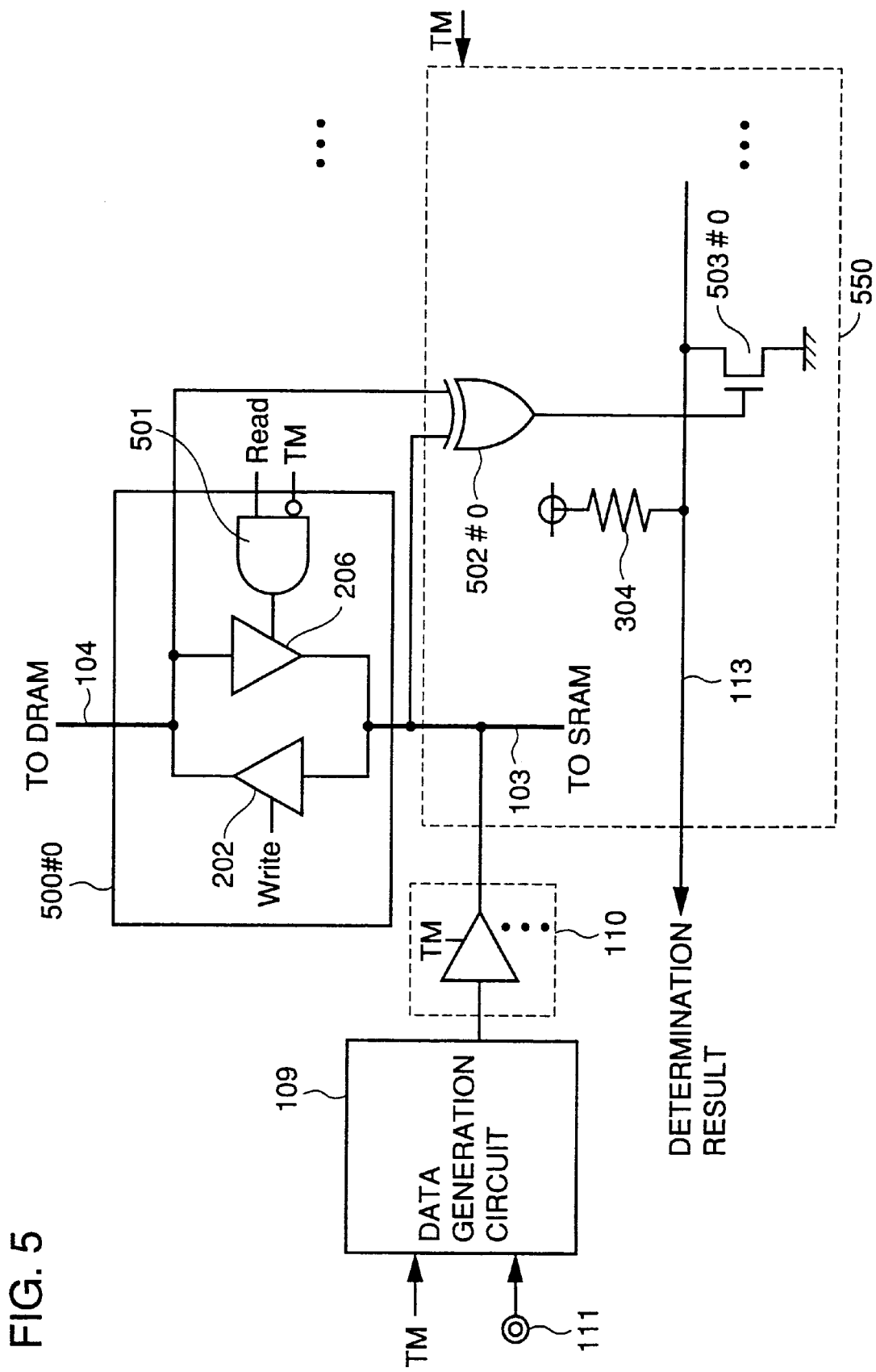

A data transfer buffer shown in FIG. 5 includes 1-bit transfer buffers 500#0, . . . and a data comparison and determination circuit 550.

1-bit transfer buffers 500#0, . . . each include tristate buffers 202, 206 and a transfer control gate 501 for the write operation.

Tristate buffer 202 outputs data on corresponding SRAM bit line 103 to corresponding internal transfer bus 104 in response to signal Write. Tristate buffer 206 outputs data on corresponding internal transfer bus 104 to corresponding SRAM bit line 103 in response to the output signal of transfer control gate 501 for the write operation.

Transfer control gate 501 for the write operation receives read signal Read and test model signal TM. In the test mode (when test mode signal TM is at the H level), transfer control gate 501 outputs an L level signal. In the normal operation mode (when test mode signal TM is at the L level), transfer control gate 501 outputs a signal at a corresponding logic level in response to signal Read.

Thus, tristate buffer 206 does not operate in the test mode and it can operate in the normal operation mode. In the test mode, therefore, SRAM bit line 103 has data for comparison (expected value data) because of data generation circuit 109 and tristate buffer 110.

Data comparison and determination circuit 550 shown in FIG. 5 includes EXOR circuits 502#0, . . . , NMOS transistors 503#0, . . . , and a resistor 304.

EXOR circuits 502#0, . . . for data comparison are arranged corresponding to the 1-bit transfer buffers. EXOR circuits 502#0, . . . each compare data on corresponding SRAM bit line 103 and corresponding read data read from the DRAM portion. In response to the comparison result, the wired OR (NMOS transistors 503#0, . . . and a pull-up resistor 304) changes the potential of signal line 113.

When data generation circuit 109 and tristate buffer 110 are operated regardless of the write/read operations and the read operation is performed according to a combination of data corresponding to a written address, random patterns can be easily addressed. Further, a silicon penalty is reduced.

Second Embodiment

A semiconductor memory device in a second embodiment of the present invention will be described with reference to FIG. 6. The same elements as semiconductor memory device 1000 shown in FIG. 1 are denoted by the same reference characters and their description will not be repeated.

Figure 6:
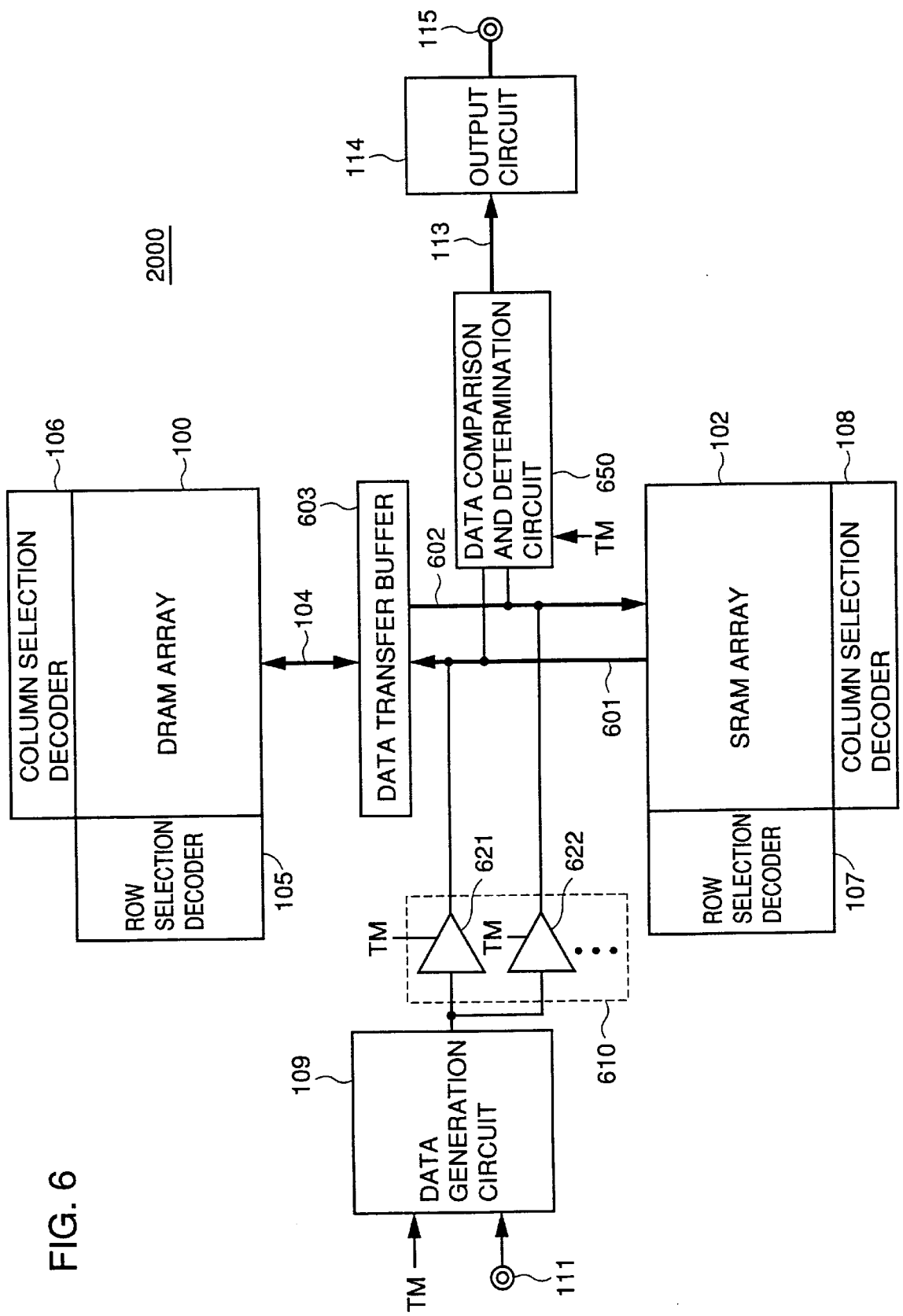
FIG. 6 shows an overall configuration of a semiconductor memory device 2000 in a second embodiment of the present invention.

A semiconductor memory device 2000 shown in FIG. 6 is different from semiconductor memory device 1000 shown in FIG. 1 in that semiconductor memory device 2000 includes SRAM bit lines 601 and 602 instead of SRAM bit line 103, a tristate buffer portion 610 instead of tristate buffer portion 110, and a data transfer buffer 603 and a data comparison and determination circuit 650 instead of data transfer buffer 101.

SRAM bit line 601 (hereinafter, referred to as a read bit line 601) transfers data received from SRAM array 102 to data transfer buffer 603. SRAM bit line 602 (hereinafter, referred to as a write bit line 602) transfers data received from data transfer buffer 603 to SRAM array 102.

Tristate buffer portion 610 includes a plurality of transfer gates corresponding to read bit lines 601 (in FIG. 6, one transfer gate 621 is shown). Tristate buffer portion 610 includes tristate buffers corresponding to write bit lines 602 (in FIG. 6, one tristate buffer 622 is shown).

Tristate buffers 621, . . . and 622, . . . transfer the output of data generation circuit 109 to corresponding read bit lines 601 or write bit lines 602 in response to test mode signal TM.

Data transfer buffer 603 is arranged between internal transfer bus 104 and read bit line 601 as well as between internal transfer bus 104 and write bit line 602.

Data comparison and determination circuit 650 compares data on read bit line 601 and data on write bit line 602 and outputs the comparison result to signal line 113. Output circuit 114 changes the potential of external output pin 115 in response to a signal on signal line 113. Data comparison and determination circuit 550 shown in FIG. 5 is an example of data comparison and determination circuit 650. In this case, data on read bit line 601 and data on corresponding write bit line 602 are compared by using the EXOR circuits arranged for every 1-bit transfer buffer. The comparison results are gathered in the wired OR circuit to output the result of collective determination to signal line 113.

The operation of FIG. 6 semiconductor memory device 2000 in the second embodiment of the present invention will be described.

In the normal operation mode, when data is transferred from the SRAM portion to the DRAM portion, data read from SRAM array 102 is transferred through readbit line 601 to data transfer buffer 603. DRAM array 100 receives the data read from SRAM array 102 from data transfer buffer 603.

When data is transferred from the DRAM portion to the SRAM portion in the normal operation mode, data read from DRAM array 100 is transferred to data transfer buffer 603. SRAM array 102 receives the data read from DRAM array 100 through write bit line 602.

The test mode in the second embodiment of the present invention includes a data transfer mode for tests and a data read and determination mode in addition to the conventional data transfer mode.

In the data transfer mode for tests, the SRAM bit lines (read bit line 601 and write bit line 602) are driven by test data in block units generated in data generation circuit 109. Thus, SRAM array 102 and DRAM array 100 are written simultaneously (collective writing in block units). In this case, the SRAM bit lines may be separate for I/O or common to I/O.

In the data read and determination mode, data in block units is simultaneously read from DRAM array 100 and SRAM array 102 and the both read data is compared each other (collective reading and determination in block units).

Specifically, in the data read determination mode, data is read in block units from DRAM array 100 and SRAM array 102 for the blocks that are previously written collectively. Data comparison and determination circuit 650 receives data read from SRAM array 102 from read bit line 601, receives data read from DRAM array 100 from write bit line 602, and compares these data. Thus, collective reading from DRAM array 100 and SRAM array 102, and comparison and determination can be performed.

The configuration of data transfer buffer 603 when SRAM bit lines are provided separately for I/O will be described with reference to FIG. 7. The configuration shown in FIG. 7 corresponds to SRAM bit lines of the I/O separation type and representatively shows a 1-bit data transfer buffer.

Figure 7:
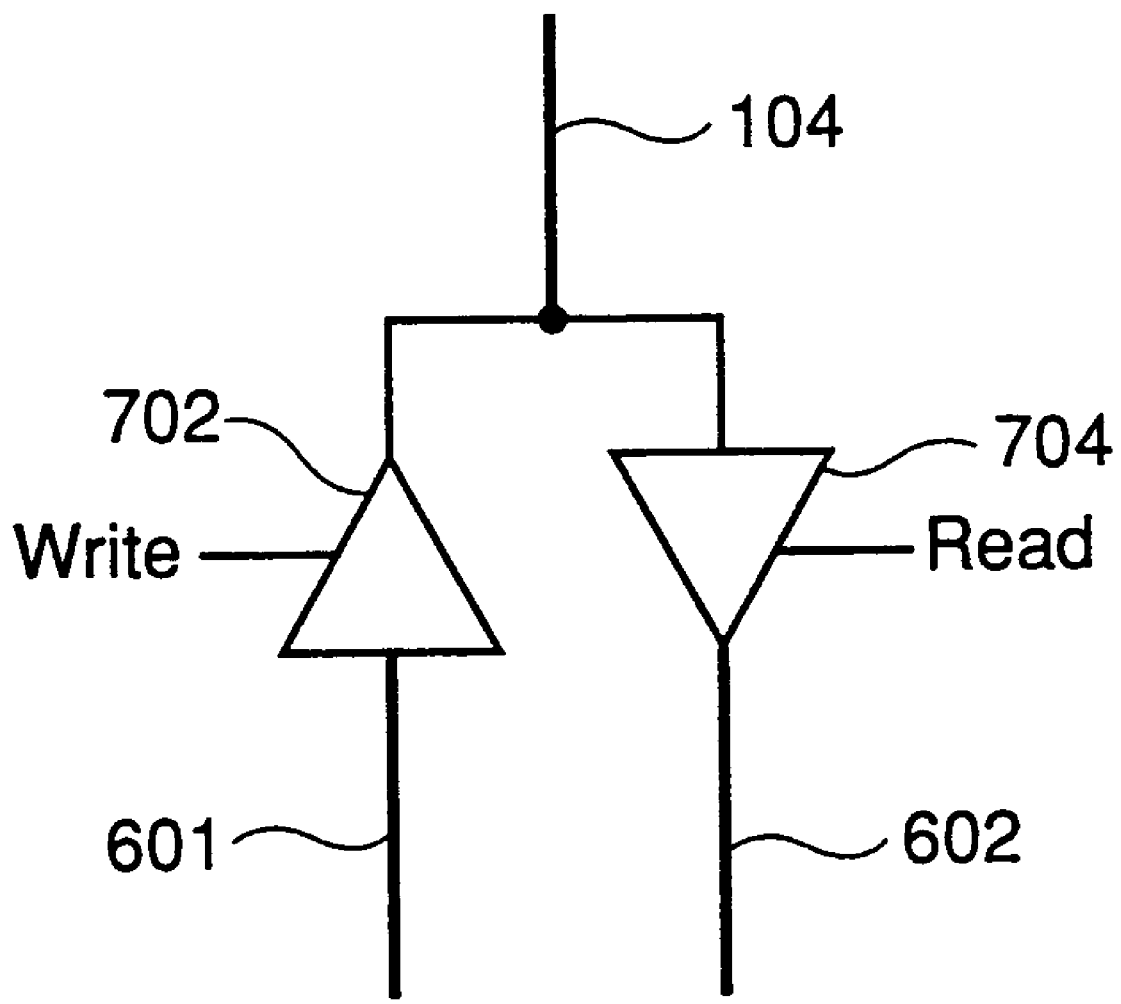
FIG. 7 is a circuit diagram showing one example of the data transfer buffer in the second embodiment of the present invention.

The 1-bit transfer buffer shown in FIG. 7 includes a tristate buffer 702 operating in response to write signal Write and tristate buffer 704 operating in response to read signal Read.

Tristate buffer 702 is arranged between corresponding read bit line 601 and corresponding internal transfer bus 104. Tristate buffer 704 is arranged between corresponding write bit line 602 and corresponding internal transfer bus 104.

In the normal operation mode, signal Write is activated when the DRAM portion is written and signal Read is activated when data is transferred to the SRAM portion.

In the data transfer mode for tests for collectively writing in block units, signal Write is activated. In the data read and determination mode for collective reading and determination, signal Read is activated. Here, signal Write in the test mode is similar to a command for transfer from the SRAM portion to the DRAM portion in the normal operation mode while signal Read in the test mode is similar to a command for transfer from the DRAM portion to the SRAM portion in the normal operation mode.

Third Embodiment

A semiconductor memory device in a third embodiment of the present invention will be described with reference to FIG. 8. The same elements as semiconductor memory device 1000 shown in FIG. 1 are denoted by the same reference characters and their description will not be repeated.

In the first and second embodiments, the configurations for collectively writing data by externally controlling the SRAM bit lines are described. In the third embodiment of the present invention, however, data is collectively written into a data transfer buffer.

Figure 8:
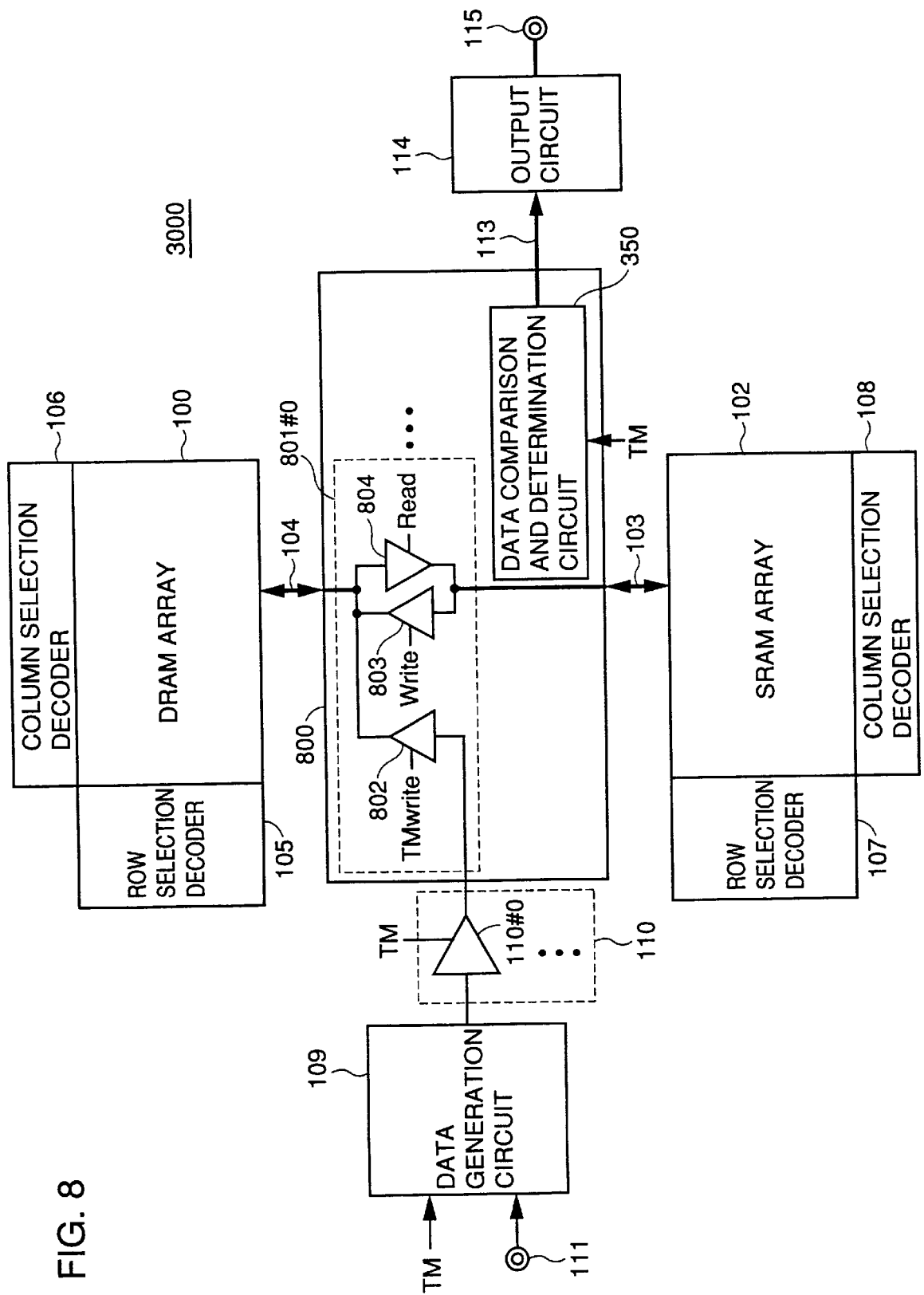
FIG. 8 shows an overall configuration of a semiconductor memory device 3000 in a third embodiment of the present invention.

A semiconductor memory device 3000 shown in FIG. 8 includes a data transfer buffer 800. Data transfer buffer 800 includes 1-bit transfer buffers 801#0, . . . and data comparison and determination circuit 350. 1-bit transfer buffers 801#0, . . . each include tristate buffers 802, 803 and 804.

Tristate buffer 802 outputs the output signal of corresponding tristate buffer 110#0 to corresponding internal transfer bus 104 in response to a test mode write signal TMwrite. Test mode write signal TMwrite is activated when collective writing is performed in the test mode. Tristate buffer 802 operates when collective writing to the DRAM portion is performed in the test mode.

Tristate buffer 803 outputs data on corresponding SRAM bit line 103 to corresponding internal transfer bus 104 in response to write signal Write. Tristate buffer 803 operates when data is transferred from the SRAM portion to the DRAM portion in the normal operation mode.

Tristate buffer 804 outputs data on corresponding internal transfer bus 104 to corresponding SRAM bit line 103 in response to read signal Read. Tristate buffer 804 operates when data is transferred from the DRAM portion to the SRAM portion in the normal operation mode.

The operation of FIG. 8 semiconductor memory device 3000 in the third embodiment of the present invention will be described.

When data transfer in block units from the SRAM portion to the DRAM portion is designated by an external command in the test mode, circuitry other than row selection decoder 107 and column selection decoder 108 in the SRAM portion operates in a normal manner.

If this happens in a conventional semiconductor memory device at this time, SRAM bit line 103 is driven by data in SRAM array 102. In the third embodiment of the present invention, however, generated test data is transferred to data transfer buffer 800 by data generation circuit 109 and tristate buffer portion 110. Thus, the generated test data is directly written to DRAM array 100 (collective writing in block units).

In short, data exchange between the SRAM bit line and the internal transfer bus can be controlled in response to test mode signal TM.

The data in block units read from the DRAM portion is transferred to the SRAM portion via data transfer buffer 800 (collective reading of the data in block units). At this time, the data is compared and determined in block units (collective determination of the data in block units) in data comparison and determination 350 included in data transfer buffer 800.

Thus, the operation of the DRAM portion can be determined without causing the SRAM portion to operate.

Fourth Embodiment

A semiconductor memory device 4000 in a fourth embodiment of the present invention will be described with reference to FIG. 9. The same elements as semiconductor memory device 1000 shown in FIG. 1 are denoted by the same reference characters and their description will not be repeated.

Figure 9:
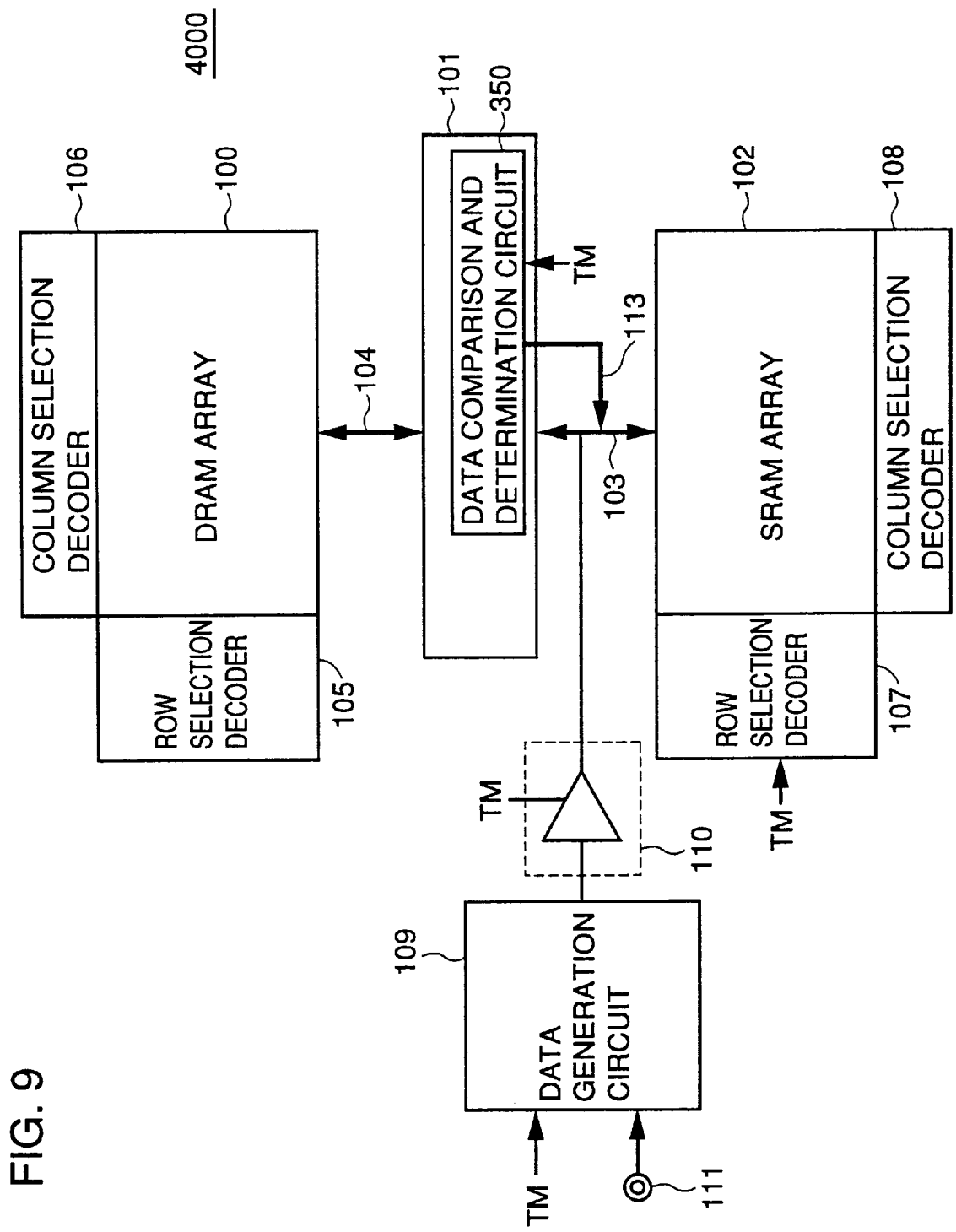
FIG. 9 shows an overall configuration of a semiconductor memory device 4000 in a fourth embodiment of the present invention.

In semiconductor memory device 4000 shown in FIG. 9, the output of data comparison and determination circuit 350 included in data transfer buffer 101 is written to SRAM bit line 103. As a result, generated test data can be directly written to the DRAM array 100 (collective writing) and the result of comparison and determination can be written to SRAM array 102 in the test mode.

Therefore, unlike semiconductor memory device 1000 in FIG. 1, the external output pin and the output circuit for representing a determination result are not required. The determination result can be externally output by using an SRAM read path (not shown) in the normal operation mode.

Even in semiconductor integrated circuit devices 2000 and 3000 shown in FIGS. 6 and 8, the number of pins used and the circuit area can be reduced by writing the result of comparison and determination to SRAM array 102.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:
   a dynamic memory cell array having a plurality of memory cells;
   a static memory cell array;

a transfer buffer transmitting and receiving data between said dynamic memory cell array and said static memory cell array;

a bus transmitting and receiving data between said static memory cell array and said transfer buffer;

test data generation means for generating test data in block units corresponding to a prescribed number of said memory cells in accordance with an external signal in a test mode to directly write the data to said bus; and writing means for writing said data in block units received from said bus by said transfer buffer to said dynamic memory cell array.

2. The semiconductor memory device according to claim 1, further comprising reading means for reading data in said block units from said dynamic memory cell array, wherein said transfer buffer includes comparison and determination means for comparing data corresponding to said test data read from said dynamic memory cell array and said test data and determining and outputting correctness/incorrectness of the data of said dynamic memory cell array in said block units in accordance with the determination result in said test mode.

3. The semiconductor memory device according to claim 2, wherein said transfer buffer further includes storing means for storing said test data in said block units, and said comparison and determination means includes comparison means for comparing data corresponding to said test data read from said dynamic memory cell array and said test data stored in said storing means in said test mode, and determination means for determining correctness/incorrectness of the data of said dynamic memory cell array in said block units in accordance with the comparison result of said comparison means.

4. The semiconductor memory device according to claim 3, further comprising means for writing the determination result of said determination means to said static memory cell array.

5. The semiconductor memory device according to claim 2, wherein said test data generation means includes generation means for generating said test data in said block units in accordance with a combination of said external signals in said test data, and drive means for writing said test data in said block units to said bus in said test mode.

6. The semiconductor memory device according to claim 1, further comprising reading means for reading data in said block units from said dynamic memory cell array, wherein said transfer buffer includes comparison means for performing, in said test mode, comparison between data read from said memory cells, to which same ones of said test data are written, among said data in block units read from said dynamic memory cell array, and determination means for determining correctness/incorrectness of the data of said dynamic memory cell array in said block units in accordance with the comparison result of said comparison means.

7. The semiconductor memory device according to claim 6, wherein said test data generation means includes generation means for generating said test data in said block units in accordance with a combination of said external signals in said test mode, and drive means for writing said test data in block units to said bus in said test mode.

8. The semiconductor memory device according to claim 6, further comprising means for writing the determination result of said determination means to said static memory cell array.

9. The semiconductor memory device according to claim 1, further comprising reading means for reading data in said block units from said dynamic memory cell array, wherein said test data generation means further generates expected value data in said block units in accordance with said external signal in said test mode, and said transfer buffer includes comparison means for comparing data corresponding to said test data read from said dynamic memory cell array and said expected value data in said test mode, and determination means for determining correctness/incorrectness of the data of said dynamic memory cell array in said block units in accordance with the comparison result of said comparison means.

10. The semiconductor memory device according to claim 9, wherein said test data generation means includes generation means for generating said test data in said block units or said expected value data in said block units in accordance with a combination of said external signals in said test mode, and drive means for writing said test data in said block units or said expected value data in said block units received from said generation means to said bus in said test mode.

11. The semiconductor memory device according to claim 9, further comprising means for writing the determination result of said determination means to said static memory cell array.

12. A semiconductor memory device, comprising:

a dynamic memory cell array including a plurality of memory cells;

a static memory cell array;

a transfer buffer transmitting and receiving data between said dynamic memory cell array and said static memory cell array;

a read bus transmitting data from said static memory cell array to said transfer buffer;

a write bus transmitting data from said transfer buffer to said static memory cell array;

test data generation means for generating test data in block units corresponding to a prescribed number of memory cells in accordance with an external signal in a test mode to directly write the data to said read bus and said write bus;

first writing means for writing the data in said block units received by said transfer buffer through said read bus to said dynamic memory cell array; and second writing means for writing the data in said block units received from said write bus to said static memory cell array.

13. The semiconductor memory device according to claim 12, further comprising:

first reading means for reading data in said block units from said dynamic memory cell array;

second reading means for reading data in said block units from said static memory cell array;

comparison means for comparing data corresponding to said test data read from said dynamic memory cell array and data corresponding to said test data read from said static memory cell array in said test mode; and determination means for determining correctness/incorrectness of the data of said dynamic memory cell array in said block units in accordance with the comparison result of said comparison means.

14. The semiconductor memory device according to claim 13, further comprising means for writing the determination result of said determination means to said static memory cell array.

15. The semiconductor memory device according to claim 12, wherein said test data generation means includes generation means for generating said test data in said block units in accordance with a combination of said external signals in said test mode, first drive means for writing said test data in said block units to said read bus in said test mode, and second drive means for writing said test data in said block units to said write bus in said test mode.

16. A semiconductor memory device, comprising;

a dynamic memory cell array including a plurality of memory cells;

a static memory cell array;

a transfer buffer transmitting and receiving data between said dynamic memory cell array and said static memory cell array;

a bus transmitting and receiving data between said static memory cell array and said transfer buffer;

test data generation means for generating test data in block units corresponding to a prescribed number of memory cells in accordance with an external signal in a test mode to directly write the data to said transfer buffer; and writing means for writing the data in said block unit received by said transfer buffer to said dynamic memory cell array, said transfer buffer transferring the test data in said block units to said dynamic memory cell array in said test mode and transferring the data received from said bus to said dynamic memory cell array in a mode other than said test mode.

17. The semiconductor memory device according to claim 16, further comprising reading means for reading data in said block units from said dynamic memory cell array, wherein said transfer buffer includes comparison means for comparing data corresponding to said test data read from said dynamic memory cell array and said test data in said test mode, and determination means for determining correctness/incorrectness of the data of said dynamic memory cell array in said block units in accordance with the comparison result of said comparison means.

18. The semiconductor memory device according to claim 17, further comprising means for writing the determination result of said determination means to said static memory cell array.

19. The semiconductor memory device according to claim 16, wherein said test data generation means includes generation means for generating said test data in said block unit in accordance with a combination of said external signals in said test mode, and drive means for writing said test data in said block units to said transfer buffer in said test mode.

* * * * *

UNITED STATES PATENT AND TRADEMARK OFFICE
CERTIFICATE OF CORRECTION

PATENT  : 5,926,424
DATED    : July 20, 1999
INVENTOR(S) : Hideaki Abe

It is certified that error appears in the above-identified patent and that said Letters Patent is hereby corrected as shown below:

On the title page, item [76], should be changed to read:
--[75]  Inventor:  Hideaki Abe, Tokyo Japan--;

insert item [73] as follows:
--[73]  Assignee:  Mitsubishi Denki Kabushiki Kaisha, Tokyo, Japan--; and before the ABSTRACT, insert the following:
--Attorney, Agent, or Firm--McDERMOTT, WILL & EMERY--.

Signed and Sealed this

First Day of February, 2000

*Attest:*

Q. TODD DICKINSON

*Attesting Officer*   *Acting Commissioner of Patents and Trademarks*